United States Patent
Chen et al.

(10) Patent No.: US 10,590,261 B2
(45) Date of Patent: Mar. 17, 2020

(54) POLYMER INTERLAYERS COMPRISING EPOXIDIZED VEGETABLE OIL

(71) Applicant: Solutia Inc., St. Louis, MO (US)

(72) Inventors: Wenjie Chen, Amherst, MA (US); Yinong Ma, Longmeadow, MA (US)

(73) Assignee: Solutia Inc., St. Louis, MO (US)

( * ) Notice: Subject to any disclaimer, the term of this patent is extended or adjusted under 35 U.S.C. 154(b) by 0 days.

(21) Appl. No.: 16/190,256

(22) Filed: Nov. 14, 2018

(65) Prior Publication Data

US 2019/0085152 A1 Mar. 21, 2019

Related U.S. Application Data

(63) Continuation of application No. 13/240,834, filed on Sep. 22, 2011, now abandoned.

(51) Int. Cl.
| | |
|---|---|
| *C08K 5/1515* | (2006.01) |
| *B32B 17/10* | (2006.01) |
| *C08K 5/11* | (2006.01) |
| *H01L 31/048* | (2014.01) |
| *C08K 5/103* | (2006.01) |
| *C08L 29/14* | (2006.01) |

(52) U.S. Cl.
CPC ...... *C08K 5/1515* (2013.01); *B32B 17/10605* (2013.01); *B32B 17/10761* (2013.01); *C08K 5/103* (2013.01); *C08K 5/11* (2013.01); *C08L 29/14* (2013.01); *H01L 31/0481* (2013.01); *Y02E 10/50* (2013.01); *Y10T 428/31844* (2015.04)

(58) Field of Classification Search
CPC ......... B23B 27/06; B23B 27/22; B23B 27/42; C08K 5/1515; C08L 59/00
See application file for complete search history.

(56) References Cited

U.S. PATENT DOCUMENTS

| | | | |
|---|---|---|---|
| 2,282,026 A | 5/1942 | Bren et al. | |
| 2,282,057 A | 5/1942 | Hopkins | |
| 4,654,179 A | 3/1987 | Cartier | |
| 5,137,954 A | 8/1992 | DasGupta et al. | |
| 5,529,848 A | 6/1996 | D'Errico | |
| 5,595,818 A | 1/1997 | Hopfe | |
| 5,728,472 A | 3/1998 | D'Errico | |
| 6,001,462 A | 12/1999 | Purvis | |
| 6,093,471 A | 7/2000 | Hopfe et al. | |
| 6,825,255 B2 | 11/2004 | Yuan | |
| 6,984,679 B2 | 1/2006 | Papenfuhs | |
| 9,180,647 B2 | 11/2015 | Chen et al. | |
| 9,579,871 B2 | 2/2017 | Chen et al. | |
| 9,962,910 B2 | 5/2018 | Chen et al. | |
| 2004/0219365 A1 | 11/2004 | Yuan | |
| 2005/0170160 A1 | 8/2005 | Moran et al. | |
| 2006/0093832 A1 | 5/2006 | Ma | |
| 2006/0216501 A1 | 9/2006 | Lin et al. | |
| 2008/0064775 A1 | 3/2008 | Wheeler et al. | |
| 2008/0102280 A1 | 5/2008 | Lu et al. | |
| 2008/0268270 A1 | 10/2008 | Chen et al. | |
| 2009/0087669 A1 | 4/2009 | Hayes et al. | |
| 2009/0281220 A1 | 11/2009 | Fenyvesi et al. | |
| 2009/0293952 A1 | 12/2009 | Koran et al. | |
| 2010/0233493 A1 | 9/2010 | Marumoto | |
| 2012/0225287 A1 | 9/2012 | Keller et al. | |
| 2013/0074931 A1 | 3/2013 | Chen | |
| 2013/0236693 A1 | 9/2013 | Lu | |

FOREIGN PATENT DOCUMENTS

| | | |
|---|---|---|
| JP | 48086916 A | 11/1973 |
| JP | 50126751 A | 10/1975 |
| JP | 51162281 A | 11/1976 |
| JP | 56037252 A | 4/1981 |
| JP | 61190543 A | 8/1986 |
| JP | 61243849 A | 10/1986 |
| JP | 09217040 A | 8/1997 |
| JP | 2004250639 A | 9/2004 |
| JP | 2008119927 A | 5/2008 |

OTHER PUBLICATIONS

Machine translation of JPS4886916 (Year: 1973).*
Notification of transmittal of the International Search Report and the written opinion of the International Searching Authority or the declaration dated Sep. 24, 2012, received in International Application No. PCT/US2011/052986 Filing Date: Sep. 23, 2011.
Notification of transmittal of the International Search Report and the written opinion of the International Searching Authority or the declaration dated Jan. 8, 2015, received in International Application No. PCT/US2014/62780 Filing Date: Oct. 29, 2014.
Wade, Bruce; "Vinyl Acetal Polymers;" Encyclopedia of Polymer Science and Technology; 2003; pp. 381-399; vol. 8; John Wiley & Sons, Inc., Hoboken, New Jersey.

* cited by examiner

Primary Examiner — Wenwen Cai
(74) Attorney, Agent, or Firm — Robert C. Morriss

(57) ABSTRACT

An interlayer comprised of a thermoplastic resin, varying amounts of an epoxidized vegetable oil, and, optionally, a conventional plasticizer. The use of a thermoplastic resin, an epoxidized vegetable (plant) oil, and, optionally, a conventional plasticizer creates synergy allowing the flow of the interlayer to be increased without sacrificing other characteristics typically associated with an increased flow (e.g., increased blocking and creep, exudation, surface roughness formation, decreased mechanical strength, and decreased manufacturing capability). In this regard, the epoxidized vegetable oil acts as a flow improvement agent, resulting in a high-flow interlayer. As a result, a thinner interlayer can be utilized in forming multiple layer panels because the resulting thinner interlayer has improved flow properties.

14 Claims, 1 Drawing Sheet

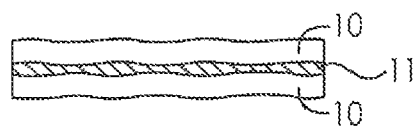

POLYMER INTERLAYERS COMPRISING EPOXIDIZED VEGETABLE OIL

BACKGROUND OF THE INVENTION

1. Field of the Invention

This disclosure is related to the field of polymer interlayers for multiple layer panels and multiple layer panels having at least one polymer interlayer sheet. Specifically, this disclosure is related to the field of polymer interlayers comprising epoxidized vegetable oil.

2. Description of Related Art

Generally, multiple layer glass panels refer to a laminate comprised of a polymer sheet or interlayer sandwiched between two panes of glass. The laminated multiple layer glass panels are commonly utilized in architectural window applications, in the windows of motor vehicles and airplanes, and in photovoltaic solar panels. The first two applications are commonly referred to as laminated safety glass. The main function of the interlayer in the laminated safety glass is to absorb energy resulting from impact or force applied to the glass, keep the layers of glass bonded even when the force is applied and the glass is broken, and prevent the glass from breaking up into sharp pieces. Additionally, the interlayer generally gives the glass a much higher sound insulation rating, reduces UV and/or IR light transmission, and enhances the aesthetic appeal of the associated window. In regards to the photovoltaic applications, the main function of the interlayer is to encapsulate the photovoltaic solar panels which are used to generate and supply electricity in commercial and residential applications.

The interlayer is generally produced by mixing a polymer resin such as poly(vinyl butyral) with one or more plasticizers and melt processing the mix into a sheet by any applicable process or method known to one of skill in the art, including, but not limited to, extrusion. Other additional additives may optionally be added for various other purposes. After the interlayer sheet is formed, it is typically collected and rolled for transportation and storage and for later use in the multiple layer glass panel, described below.

The following offers a simplified description of the manner in which multiple layer glass panels are generally produced in combination with the interlayers. First, at least one polymer interlayer sheet is placed between two substrates and any excess interlayer is trimmed from the edges, creating an assembly. It is not uncommon for multiple polymer interlayer sheets to be placed within the two substrates creating a multiple layer glass panel with multiple polymer interlayers. Then, air is removed from the assembly by an applicable process or method known to one of skill in the art; e.g., through nip rollers, vacuum bag or another deairing mechanism. Additionally, the interlayer is partially press-bonded to the substrates by any method known to one of ordinary skill in the art. In a last step, in order to form a final unitary structure, this preliminary bonding is rendered more permanent by a high temperature and pressure lamination process known to one of ordinary skill in the art such as, but not limited to, autoclaving.

Generally, two (2) common problems are encountered in the art of manufacturing multiple layer glass panels: delamination and bubbling from inefficient de-gassing. Delamination is the splitting or separating of the laminate into the individual layers, e.g., the separating of the substrates from the interlayer. This typically occurs around the edges of the multiple layer glass and is usually the result of the breakdown of the bond between the glass and the interlayer by atmospheric moisture attack or panel sealant degradation, or excessive stress imposed on the glass. Some degree of edge delamination is a common problem in multiple layer glass panels. Certain conditions tend to accelerate the manifestation of edge delamination, especially when one or more of the substrates is wavy or warped. Furthermore, if the delamination extends too far into the panel, the structural integrity of the glass panel may become compromised.

De-gassing is the removal of the presence of gas or air in a multiple layer glass panel. Gas trapped in a multiple layer glass panel can have a negative or degenerative effect on the optical clarity and adhesion of the panel. During the manufacturing process of laminated multiple layer glass panel constructs, gases can become trapped in the interstitial spaces between the substrates and the one or more polymer interlayers. Generally, this trapped air is removed in the glazing or panel manufacturing process by vacuum de-airing the construct, nipping the assembly between a pair of rollers or by some other method known to those of skill in the art. However, these technologies are not always effective in removing all of the air trapped in the interstitial spaces between the substrates, especially when one or more of the substrates is wavy or warped. Generally, the presence of a gas in the interstitial spaces of a multiple layer glass panel takes the form of bubbles in the polymer interlayer sheet(s) or pockets of gas between the polymer interlayer sheet(s) and the substrates—known as "bubbling".

Delamination and bubbling are particularly evident and acute when the interlayer is used in conjunction with warped or wavy glass, including, but not limited to, tempered glass, heat strengthened/toughened glass, mismatched glass, bent glass for making windshields, and in photovoltaic applications. For example, the processing of tempering glass creates some distortion and roller waves, and thus tempered glass is generally not as flat as ordinary annealed glass. In such applications, the waviness of the substrates creates gaps between the substrates themselves and between the substrates and the interlayer, resulting in an increased tendency of delamination and bubble formation. Both delamination and bubble formation are undesirable and problematic where the end-product multiple layer glass panel will be used in an application where optical quality or structural integrity is important. Thus, the creation of a near perfect laminated glass essentially free of any gaseous pockets or bubbles is paramount in the multiple layer glass panel manufacturing process. Not only is it important to create a multiple layer glass panel free of gaseous pockets and bubbles immediately after manufacturing, but permanency is also important. It is not an uncommon defect in the art of multiple layer glass panels for dissolved gases to appear (e.g., for bubbles to form) in the panel over time, especially at elevated temperatures and under certain weather conditions and sunlight exposure. More gases or air will be trapped in the laminated panels if glass panels are warped and waved. The excessive air trapped in the laminated panels will significantly reduce the tolerance of the panels for the elevated temperatures and adverse weather conditions, i.e., bubbles could be formed at lower temperatures. Thus, it is also important that, in addition to leaving the laminate production line free from any bubbles or gaseous cavities, the multiple layer glass panel remain gas-free for a substantial period of time under end-use conditions to fulfill its commercial role.

As a measure to prevent delamination and bubbling with warped glass, it has become common to either increase the flow (e.g., with an increase in plasticizer loading), the thickness, or both of the interlayer. This increases the capability of the interlayer to fill the gaps that are inherent in the use of warped glass substrates. However, there are several problems with these interlayer compositions previously utilized in the art. For example, with an increase in thickness comes an increase in both cost and price. Additionally, increasing flow creates other problems of its own, including: blocking, plasticizer exudation, creep, surface roughness formation, decreased mechanical strength, and decreased manufacturing capability.

Blocking is generally known to those of skill in the art as the sticking of polymer interlayers to each other. Blocking can be a problem during the manufacturing, storage and distribution of polymer interlayer sheets, where it is not uncommon for the polymer interlayer sheets (which in some processes are stored in rolls) to come into contact with each other. When the flow of the interlayer is increased, generally the interlayer is softer and becomes more susceptible to blocking, and as a result, it can be difficult, if not impossible, to separate the polymer interlayer sheets.

Exudation is a parameter used to measure the compatibility of plasticizers with the associated polymer resin. Compatibility is the ability of the plasticizer to form a homogenous system with the polymer resin. During mixing in roll mixers or in an extruder the plasticizer is dispersed in the polymer as a result of mechanical energy. If the plasticizer content is above its saturation point, exudation occurs and the plasticizer flows out of the interlayer, which will impose difficulties with the handling of the interlayer and cause contamination on the interlayer and the processing equipment.

Creep is the tendency of the solid interlayer material to slowly move or deform permanently under the influence of stresses. Creep can be problematic because multiple layer glass panels tend to become deformed and elongated as a result of the creep of interlayer. For example, over time the two glass panels may begin to slide apart from one another. It generally results from the viscoelastic flow of the polymer with time. Thus, with previous attempts at increasing flow came a greater tendency for creep and the resultant deformation of the interlayer. In some situations, this creep can result in structural defects and decreased mechanical strength of the interlayer and the resultant multiple layer glass panel.

The surface roughness is generally known to those of skill in the art as the measure of the finer surface irregularities in the texture of the interlayer surface, i.e., peaks and spaces there between on the surface distinguished from the imaginary plane of the flattened polymer interlayer sheet. An appropriate level of surface roughness is needed for good de-gassing performance during lamination. If the surface roughness is too low, de-gassing will become impossible. On the other hand, if the surface roughness is too high, the large surface irregularities in the interlayer will be difficult to remove during lamination, resulting in more gas being trapped in the multiple layer glass panel. Either too low or too high surface roughness will result in poor de-gassing performance and cause more bubbling and delamination described above. Generally, the degree of surface roughness is the result of the manufacturing process employed to create the interlayer and is affected by the flow of the interlayer. In general the increase of flow will result in the decrease of surface roughness, which will make de-gassing more difficult, causing more bubbling and delamination. Again, such bubbling and delamination is undesirable and can result in structural defects and decreased mechanical strength of the interlayer and the resultant multiple layer glass panel.

Summarized, delamination and bubbling are common problems in the field of multiple layer glass panels which are particularly acute when using wavy or warped substrates. In an attempt to correct these problems associated with wavy or warped substrates, it became common to use an interlayer with an increased thickness or flow or both. The increased thickness and/or flow of the previously utilized interlayers, however, resulted in numerous other unfavorable sacrifices, including, but not limited to, increased manufacturing costs (i.e., the costs associated with an increased thickness in the interlayer), blocking, creep, exudation, surface roughness formation, decreased mechanical strength, and decreased manufacturing capability.

SUMMARY OF THE INVENTION

Because of these and other problems in the art, described herein, among other things is a high-flow interlayer comprising: a poly(vinyl butyral) resin; and a mixture comprising: at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate; and epoxidized vegetable oil. The interlayer also comprises about 15 to about 100 parts mixture per one hundred parts poly(vinyl butyral) resin.

In certain embodiments, the mixture in the interlayer comprises about 10 to about 75 parts plasticizer selected from said group per one hundred parts poly(vinyl butyral) resin. The mixture also may comprise about 25 to about 50 parts plasticizer selected from said group per one hundred parts poly(vinyl butyral) resin. In another embodiment, the mixture comprises about 5 to about 90 parts epoxidized vegetable oil per one hundred parts poly(vinyl butyral) resin. The mixture also may comprise about 5 to about 25 parts epoxidized vegetable oil per one hundred parts poly(vinyl butyral) resin.

In certain embodiments, the epoxidized vegetable oil is selected from the group consisting of: epoxidized soybean oil and epoxidized linseed oil. In other embodiments, the epoxidized vegetable oil is epoxidized soybean oil. The high-flow interlayer also can be a multilayered interlayer.

Also disclosed herein is a multiple layer panel comprising: at least one rigid substrate; and a high-flow interlayer. The high-flow interlayer comprises: poly(vinyl butyral) resin; and a mixture comprising: at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate; and epoxidized vegetable oil. Further, the high-flow interlayer comprises about 15 to about 100 parts mixture per one hundred parts poly(vinyl butyral) resin.

In certain embodiments, the mixture comprises about 5 to about 90 parts epoxidized vegetable oil per one hundred parts poly(vinyl butyral) resin. In other embodiments, the epoxidized vegetable oil is selected from the group consisting of: epoxidized soybean oil and epoxidized linseed oil. The panel also may further comprise a photovoltaic cell, with the high-flow interlayer encapsulating the photovoltaic cell.

Also disclosed herein is an interlayer comprising a poly(vinyl butyral) layer comprising about 60 to about 100 parts epoxidized vegetable per 100 parts poly(vinyl butyral). This poly(vinyl butyral) layer has a glass transition temperature of about 10° C. or less. In other embodiments, the poly(vinyl butyral) layer can have a glass transition temperature of about 4° C. or less.

The poly(vinyl butyral) layer also may further comprise at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate. In this embodiment, the poly(vinyl butyral) layer comprises a combined total of less than about 100 parts epoxidized vegetable oil and plasticizer per one hundred parts poly(vinyl butyral).

In certain embodiments, the interlayer is a multilayered interlayer. In other embodiments, the interlayer may further comprise a second poly(vinyl butyral) layer and a third poly(vinyl butyral) layer with the second and third poly(vinyl butyral) layers having a glass transition temperatures of about 25° C. to about 40° C., and with the first poly(vinyl butyral) layer disposed between the second and third poly(vinyl butyral) layers.

Also disclosed herein is an interlayer comprising a poly(vinyl butyral) layer comprising between 2 and 20 parts epoxidized vegetable per 100 parts poly(vinyl butyral). This poly(vinyl butyral) layer has a glass transition temperature of about 35° C. or greater. The poly(vinyl butyral) layer may have a glass transition temperature of about 39° C. or greater.

In some embodiments, the poly(vinyl butyral) layer may further comprise: at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate. In this embodiment, the poly(vinyl butyral) layer comprises a combined total of about 50 or less parts epoxidized vegetable oil and plasticizer per 100 parts poly(vinyl butyral).

In certain embodiments, the interlayer is a multilayered interlayer. In other embodiments, the interlayer may further comprise a second poly(vinyl butyral) layer and a third poly(vinyl butyral) layer with the second and third poly(vinyl butyral) layers having glass transition temperatures of about 20° C. to about 35° C., and with the first poly(vinyl butyral) layer disposed between the second and third poly(vinyl butyral) layers.

Also disclosed herein is a multiple layer panel comprising: at least one rigid substrate; and a poly(vinyl butyral) layer comprising about 60 to about 100 parts epoxidized vegetable per 100 parts poly(vinyl butyral) and having a glass transition temperature of about 10° C. or less. The poly(vinyl butyral) layer also could have a glass transition temperature of about 4° C. or less.

In some embodiments, the poly(vinyl butyral) layer further comprises at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate. In this embodiment, the poly(vinyl butyral) layer comprises a combined total of less than about 100 parts epoxidized vegetable oil and plasticizer per one hundred parts poly(vinyl butyral).

In some embodiments, the interlayer is a multilayered interlayer. In other embodiments, the interlayer may comprise second poly(vinyl butyral) layer and a third poly(vinyl butyral) layer with the second and third poly(vinyl butyral) layers having glass transition temperatures of about 25° C. to about 40° C., and with the first poly(vinyl butyral) layer disposed between the second and third poly(vinyl butyral) layers.

In certain embodiments, the rigid substrate is glass. In other embodiments, the panel may further comprise a photovoltaic cell, with the interlayer encapsulating the photovoltaic cell.

Also disclosed herein is a multiple layer panel comprising: at least one rigid substrate; and a poly(vinyl butyral) layer comprising between 2 and 20 parts epoxidized vegetable per 100 parts poly(vinyl butyral) and having a glass transition temperature of about 35° C. or greater. The poly(vinyl butyral) layer also could have a glass transition temperature of about 39° C. or greater.

In some embodiments, the poly(vinyl butyral) layer further comprises at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate. In this embodiment, the poly(vinyl butyral) layer comprises a combined total of less than about 50 parts epoxidized vegetable oil and plasticizer per one hundred parts poly(vinyl butyral).

In some embodiments, the interlayer is a multilayered interlayer. In other embodiments, the interlayer may comprise second poly(vinyl butyral) layer and a third poly(vinyl butyral) layer with the second and third poly(vinyl butyral) layers having a glass transition temperatures of about 20° C. to about 35° C., and with the first poly(vinyl butyral) layer disposed between the second and third poly(vinyl butyral) layers.

In certain embodiments, the rigid substrate is glass. In other embodiments, the panel may further comprise a photovoltaic cell, with the interlayer encapsulating the photovoltaic cell.

BRIEF DESCRIPTION OF THE DRAWINGS

FIG. 1 depicts one embodiment of an interlayer comprising epoxidized vegetable oil placed between two warped substrates to form a multiple layer glass panel.

DESCRIPTION OF THE PREFERRED EMBODIMENT(S)

Described herein, among other things, are interlayers comprised of a thermoplastic resin, an epoxidized vegetable oil, and, optionally, conventional plasticizer. The use of a thermoplastic resin, an epoxidized vegetable (plant) oil, and, optionally, a conventional plasticizer creates synergy allowing the flow of the interlayer to be increased without sacrificing other characteristics typically associated with an increased flow (e.g., increased blocking and creep, exudation, surface roughness formation, decreased mechanical strength, and decreased manufacturing capability). In this regard, the epoxidized vegetable oil acts as a flow improvement agent, resulting in a high-flow interlayer. As a result, a thinner interlayer can be utilized in forming multiple layer panels because the resulting thinner interlayer has improved flow properties.

The terms "polymer interlayer sheet," "interlayer," and "polymer melt sheet" as used herein, generally may designate a single-layer sheet or a multilayered interlayer. A "single-layer sheet," as the names implies, is a single polymer layer extruded as one layer. A multilayered interlayer, on the other hand, may comprise multiple layers, including separately extruded layers, co-extruded layers, or any combination of separately and co-extruded layers. Thus the multilayered interlayer could comprise, for example: two or more single-layer sheets combined together ("plural-layer sheet"); two or more layers co-extruded together ("co-extruded sheet"); two or more co-extruded sheets combined together; a combination of at least one single-layer sheet and at least one co-extruded sheet; and a combination of at least one plural-layer sheet and at least one co-extruded sheet. In various embodiments of the present disclosure, a multilayered interlayer comprises at least two polymer layers (e.g., a single layer or multiple layers co-extruded) disposed in direct contact with each other, wherein each layer comprises a polymer resin, as detailed more fully below. As used herein, "skin layer" generally refers to outer layers of the interlayer and "core layer" generally refers to the inner layer(s). Thus, one exemplary embodiment would be: skin layer//core layer//skin layer. It should be noted, however, further embodiments include interlayers having more than three layers (e.g., 4, 5, 6, or up to 10 individual layers). Additionally, any multilayered interlayer utilized can be varied by manipulating the composition, thickness, or positioning of the layers and the like. For example, in one tri-layer polymer interlayer sheet, the two surface layers may comprise poly(vinyl butyral) ("PVB") resin with a conventional plasticizer and epoxidized vegetable oil, while the middle layer may comprise a different PVB resin or different thermoplastic material with or without the addition of a conventional plasticizer and/or epoxidized vegetable oil, or the like. Thus, it is contemplated that the skin layers and the core layer(s) of the multilayered interlayer sheets may be comprised of the same thermoplastic material or different thermoplastic materials.

Although the embodiments described below refer to the polymer resin as being PVB, it would be understood by one of ordinary skill in the art that the polymer may be any polymer suitable for use in a multiple layer panel. Typical polymers include, but are not limited to, PVB, polyurethane, polyvinyl chloride, poly(ethylene-co-vinyl acetate), combinations of the foregoing, and the like. PVB, polyvinyl chloride, and polyurethane are preferred polymers generally for interlayers; PVB is particularly preferred when used in conjunction with the interlayers of this disclosure comprising epoxidized vegetable oil.

In order to facilitate a more comprehensive understanding of the interlayer comprising epoxidized vegetable oil disclosed herein, this application begins with a summary of common components found in an interlayer, both generally and in interlayers of the present disclosure, and the formation thereof, prior to discussing the addition of the epoxidized vegetable oil into the interlayer as a flow improvement agent.

The PVB resin is produced by known aqueous or solvent acetalization processes reacting polyvinyl alcohol ("PVOH") with butyraldehyde in the presence of an acid catalyst, separation, stabilization, and drying of the resin. Such acetalization processes are disclosed, for example, in U.S. Pat. Nos. 2,282,057 and 2,282,026 and Vinyl Acetal Polymers, in Encyclopedia of Polymer Science & Technology, 3rd edition, Volume 8, pages 381-399, by B. E. Wade (2003), the entire disclosures of which are incorporated herein by reference. The resin is commercially available in various forms, for example, as Butvar® Resin from Solutia Inc.

As used herein, residual hydroxyl content (calculated as PVOH) refers to the amount of hydroxyl groups remaining on the polymer chains after processing is complete. For example, PVB can be manufactured by hydrolyzing poly(vinyl acetate) to PVOH, and then reacting the PVOH with butyraldehyde. In the process of hydrolyzing the poly(vinyl acetate), typically not all of the acetate side groups are converted to hydroxyl groups. Further, reaction with butyraldehyde typically will not result in all hydroxyl groups being converted to acetal groups. Consequently, in any finished poly(vinyl butyral), there typically will be residual acetate groups (as vinyl acetate groups) and residual hydroxyl groups (as vinyl hydroxyl groups) as side groups on the polymer chain. As used herein, residual hydroxyl content is measured on a weight percent basis per ASTM 1396.

In various embodiments, the poly(vinyl butyral) resin comprises about 9 to about 35 weight percent (wt. %) hydroxyl groups calculated as PVOH, about 13 to about 30 wt. % hydroxyl groups calculated as PVOH, about 9 to about 22 wt. % hydroxyl groups calculated as PVOH, or about 15 to about 22 wt. % hydroxyl groups calculated as PVOH; and most preferably, for certain embodiments, about 17.75 to about 19.85 wt. % hydroxyl groups calculated as PVOH. The resin can also comprise less than 15 wt. % residual ester groups, less than 13 wt. %, less than 11 wt. %, less than 9 wt. %, less than 7 wt. %, less than 5 wt. %, or less than 1 wt. % residual ester groups calculated as polyvinyl ester, e.g., acetate, with the balance being an acetal, preferably butyraldehyde acetal, but optionally including other acetal groups in a minor amount, for example, a 2-ethyl hexanal group (see, for example, U.S. Pat. No. 5,137,954, the entire disclosure of which is incorporated herein by reference).

Notably, for a given type of plasticizer, the compatibility of the plasticizer in the polymer is largely determined by the hydroxyl content of the polymer. Polymers with greater residual hydroxyl content are typically correlated with reduced plasticizer compatibility or capacity. Conversely, polymers with a lower residual hydroxyl content typically will result in increased plasticizer compatibility or capacity. Generally, this correlation between the residual hydroxyl content of a polymer and plasticizer compatibility/capacity can be manipulated and exploited to allow for addition of the proper amount of plasticizer to the polymer resin and to stably maintain differences in plasticizer content between multiple interlayers.

The PVB resin of the present disclosure typically has a molecular weight of greater than 50,000, preferably about 70,000 to about 250,000 Daltons, as measured by size exclusion chromatography using low angle laser light scattering. As used herein, the term "molecular weight" means the weight average molecular weight.

Various adhesion control agents ("ACAs") can be used in the interlayers of the present disclosure. ACAs in the interlayer formulation control adhesion of the sheet to glass to provide energy absorption on impact of the glass laminate. In various embodiments of interlayers of the present disclosure, the interlayer can comprise about 0.003 to about 0.15 parts ACAs per 100 parts resin; about 0.01 to about 0.10 parts ACAs per 100 parts resin; and about 0.01 to about 0.04 parts ACAs per 100 parts resin. Such ACAs, include, but are not limited to, the ACAs disclosed in U.S. Pat. No. 5,728,472 (the entire disclosure of which is incorporated herein by reference), residual sodium acetate, potassium acetate, magnesium bis(2-ethyl butyrate), and/or magnesium bis(2-ethylhexanoate).

Other additives may be incorporated into the interlayer to enhance its performance in a final product and impart certain additional properties to the interlayer. Such additives include, but are not limited to, dyes, pigments, stabilizers (e.g., ultraviolet stabilizers), antioxidants, anti-blocking agents, flame retardants, IR absorbers or blockers (e.g., indium tin oxide, antimony tin oxide, lanthanum hexaboride ($LaB_6$) and cesium tungsten oxide), processing aides, flow enhancing additives, lubricants, impact modifiers, nucleating agents, thermal stabilizers, UV absorbers, UV stabilizers, dispersants, surfactants, chelating agents, coupling agents, adhesives, primers, reinforcement additives, and fillers, among other additives known to those of ordinary skill in the art.

In various embodiments of interlayers of the present disclosure, the interlayer can comprise 0 to about 80, about 10 to about 75, about 15 to about 60, about 25 to about 50, about 15 to about 50, about 10 to about 40, about 15 to about 40, about 25 to about 38, about 29 to about 32, and about 30 phr (parts per hundred parts resin) conventional plasticizer. Of course, other quantities can be used as is appropriate for the particular application.

In some embodiments, the conventional plasticizer has a hydrocarbon segment of fewer than 20, fewer than 15, fewer than 12, or fewer than 10 carbon atoms. Suitable conventional plasticizers for use in these interlayers include esters of a polybasic acid or a polyhydric alcohol, among others. Suitable plasticizers include, for example, triethylene glycol di-(2-ethylhexanoate) ("3GEH"), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, dibutyl sebacate, and mixtures thereof. A more preferred plasticizer is 3GEH.

As used herein, the amount of plasticizer, or any other component in the interlayer, can be measured as parts per hundred parts resin (phr), on a weight per weight basis. For example, if 30 grams of plasticizer is added to 100 grams of polymer resin, then the plasticizer content of the resulting plasticized polymer would be 30 phr. As used herein, when the plasticizer content of the interlayer is given, the plasticizer content is determined with reference to the phr of the plasticizer in the melt that was used to produce the interlayer.

Plasticizers work by embedding themselves between chains of polymers, spacing them apart (increasing the "free volume") and thus significantly lowering the glass transition temperature ($T_g$) of the polymer resin (typically by 0.5-4° C./phr), making the material softer. In this regard, the amount of plasticizer in the interlayer can be adjusted to affect the glass transition temperature ($T_g$). The glass transition temperature ($T_g$) is the temperature that marks the transition from the glassy state of the interlayer to the elastic state. In general, higher amounts of plasticizer loading will result in lower $T_g$. Conventional, previously utilized interlayers generally have had a $T_g$ in the range of about 0° C. for acoustic (noise reducing) interlayer to about 45° C. for hurricane and aircraft interlayer applications. Surprisingly, with the addition of the epoxidized vegetable oil alone or in combination with a conventional plasticizer as described below, the interlayers of the present disclosure are able to maintain approximately the same glass transition temperature as the previously utilized conventional interlayers, i.e., 0° C. to 45° C., even at much higher total combined amounts of the conventional plasticizer and epoxidized vegetable oil. A particularly preferred $T_g$ for certain embodiments (e.g., certain single-layered interlayers comprising epoxidized vegetable oil in combination with a conventional plasticizer) is in the range of about 30° C. to about 35° C.

An interlayer's glass transition temperature is also correlated with the stiffness of the interlayer—the higher the glass transition temperature, the stiffer the interlayer. Generally, an interlayer with a glass transition temperature of 30° C. or higher increases windshield strength and torsional rigidity. A soft interlayer (generally characterized by an interlayer with a glass transition temperature of lower than 30° C.), on the other hand, contributes to the sound dampening effect (i.e., the acoustic characteristics). The interlayers of the present disclosure have glass transition temperatures of about 30° C. or greater, about 35° C. or greater, about 10° C. or less, and about 4° C. or less. The multilayered interlayers of the present disclosure combine these two advantageous properties (i.e., strength and acoustic) by utilizing harder or stiffer skin layers laminated with a softer core layer (e.g., stiff//soft//stiff) and softer skin layers laminated with a stiffer core layer (e.g., soft//stiff//soft). In various embodiments, the multilayered interlayers generally comprise skin layers with a glass transition temperature of about 25° C. to about 40° C., about 20° C. to about 35° C., about 25° C. or greater, about 30° C. or greater, and about 35° C. or greater, and core layer(s) of about 39° C. or greater, about 35° C. or greater, about 35° C. or less, about 10° C. or less, and about 4° C. or less. For example, the following are some preferred multilayered configurations:

$(T_g>25°$ C.$)//(T_g<10°$ C.$)//(T_g>25°$ C.$)$;

$(25°$ C.$<T_g<40°$ C.$)//(T_g<10°$ C.$)//(25°$ C.$<T_g<40°$ C.$)$;

$(T_g<35°$ C.$)//(T_g>35°$ C.$)//(T_g<35°$ C.$)$; and $(20°$ C.$<T_g<35°$ C.$)//(T_g>35°$ C.$)//(20°$ C.$<T_g<35°$ C.$)$.

These configurations are merely exemplary and are in no way meant to be limiting to the types of multilayered configurations contemplated by this disclosure.

Additionally, it is contemplated that polymer interlayer sheets as described herein may be produced by any suitable process known to one of ordinary skill in the art of producing polymer interlayer sheets that are capable of being used in a multiple layer panel (such as a glass laminate or a photovoltaic module or solar panel). For example, it is contemplated that the polymer interlayer sheets may be formed through solution casting, compression molding, injection molding, melt extrusion, melt blowing or any other procedures for the production and manufacturing of a polymer interlayer sheet known to those of ordinary skill in the art. Further, in embodiments where multiple polymer interlayers are utilized, it is contemplated that these multiple polymer interlayers may be formed through co-extrusion, blown film, dip coating, solution coating, blade, paddle, air-knife, printing, powder coating, spray coating or other processes known to those of ordinary skill in the art. While all methods for the production of polymer interlayer sheets known to one of ordinary skill in the art are contemplated as possible methods for producing the polymer interlayer sheets described herein, this application will focus on polymer interlayer sheets produced through the extrusion and co-extrusion processes. The final multiple layer glass panel laminate and photovoltaic module of the present invention are formed using processes known in the art.

Generally, in its most basic sense, extrusion is a process used to create objects of a fixed cross-sectional profile. This is accomplished by pushing or drawing a material through a die of the desired cross-section for the end product.

Generally, in the extrusion process, thermoplastic resin and plasticizers, including any of those resins and plasticizers described above, are pre-mixed and fed into an extruder device. Additives such as colorants and UV inhibitors (in liquid, powder, or pellet form) are often used and can be mixed into the thermoplastic resin or plasticizer prior to arriving in the extruder device. These additives are incorporated into the thermoplastic polymer resin, and by extension the resultant polymer interlayer sheet, to enhance certain properties of the polymer interlayer sheet and its performance in the final multiple layer glass panel product (or photovoltaic module).

In the extruder device, the particles of the thermoplastic raw material and plasticizers, including any of those resin, conventional plasticizers, epoxidized vegetable oil, and other additives described above, are further mixed and melted, resulting in a melt that is generally uniform in temperature and composition. Once the melt reaches the end of the extruder device, the melt is propelled into the extruder die. The extruder die is the component of the thermoplastic extrusion process which gives the final polymer interlayer sheet product its profile. Generally, the die is designed such that the melt evenly flows from a cylindrical profile coming out of the die and into the product's end profile shape. A plurality of shapes can be imparted to the end polymer interlayer sheet by the die so long as a continuous profile is present.

Notably, for the purposes of this application, the polymer interlayer at the state after the extrusion die forms the melt into a continuous profile will be referred to as a "polymer melt sheet." At this stage in the process, the extrusion die has imparted a particular profile shape to the thermoplastic resin, thus creating the polymer melt sheet. The polymer melt sheet is highly viscous throughout and in a generally molten state. In the polymer melt sheet, the melt has not yet been cooled to a temperature at which the sheet generally completely "sets." Thus, after the polymer melt sheet leaves the extrusion die, generally the next step in presently employed thermoplastic extrusion processes is to cool the polymer melt sheet with a cooling device. Cooling devices utilized in the previously employed processes include, but are not limited to, spray jets, fans, cooling baths, and cooling rollers. The cooling step functions to set the polymer melt sheet into a polymer interlayer sheet of a generally uniform non-molten cooled temperature. In contrast to the polymer melt sheet, this polymer interlayer sheet is not in a molten state and is not highly viscous. Rather, it is the set final-form cooled polymer interlayer sheet product. For the purposes of this application, this set and cooled polymer interlayer will be referred to as the "polymer interlayer sheet."

In some embodiments of the extrusion process, a co-extrusion process may be utilized. Co-extrusion is a process by which multiple layers of polymer material are extruded simultaneously. Generally, this type of extrusion utilizes two or more extruders to melt and deliver a steady volume throughput of different thermoplastic melts of different viscosities or other properties through a co-extrusion die into the desired final form. The thickness of the multiple polymer layers leaving the extrusion die in the co-extrusion process can generally be controlled by adjustment of the relative speeds of the melt through the extrusion die and by the sizes of the individual extruders processing each molten thermoplastic resin material.

Generally, the thickness, or gauge, of the polymer interlayer sheet will be in a range from about 15 mils to 60 mils, about 20 mils to about 50 mils, and about 15 mils to about 30 mils (with the skin and core layers of the multilayered interlayer having thicknesses of about 2 mils to about 28 mils). However, when the interlayer is used in conjunction with wavy or warped substrates, it has become common practice to employ interlayers on the thicker end of this range, for example, 30 mil, 45 mil, and 60 mil, depending on the warpage of the substrate. As discussed more fully below, the formulations described in this invention using the combination of a conventional plasticizer and epoxidized vegetable oils advantageously allows for the improvement of flow, such as when the laminate is autoclaved, without sacrificing other properties, thereby allowing the use of thinner interlayers; for example, 22 mil interlayers can replace the 30 mil conventional interlayer and 33 mil interlayer can replace the 45 mil conventional interlayer in the tempered laminated glass, or any other laminates having mismatched glass pairs. Thus, the cost of manufacturing and production can be reduced.

Epoxidized vegetable oils are known as a common class of additives to poly(vinyl chloride) ("PVC") for use as plasticizers and stabilizers particularly. During the processing of PVC, chloride reacts with hydrogen to form hydrochloric acid ("HCl"). HCl can be a source of undesirable color characteristics and instability of the final PVC. Further, epoxidized vegetable oil functions as an acid scavenger to neutralize the HCl. For this reason, it is also referred to as a thermal stabilizer. However, the use of epoxidized vegetable oils with PVB has been virtually non-existent, and in fact, discouraged. One reason is because there is no chloride in PVB and thus no need for an acid scavenger in the processing of PVB. Additionally, due to the large molecule size and molecular structure of the epoxidized vegetable oil, using epoxidized vegetable oil itself with the standard PVB resin does not produce the polymer interlayer that is fully equivalent to the conventional interlayer in terms of such properties as stiffness, $T_g$, adhesion to glass and the like.

Unexpectedly, however, it now has been discovered that epoxidized vegetable oil can be successfully used alone or in combination with a conventional plasticizer to increase the flow in PVB interlayers while not negatively affecting other properties of the interlayers. As used herein, epoxidized vegetable oil refers to actual oil in its natural form (or the triglyceride) which has been epoxidized. This is contrasted with the epoxidation of the mono-alkyl (e.g., methyl, propyl, or ethyl) esters of the oil, which are also commonly referred to in the art as biodiesel. The epoxidized vegetable oils of the present disclosure include, but are not limited to, soybean oil, palm oil, olive oil, corn oil, canola oil, linseed oil, rapeseed oil, castor oil, coconut oil, cottonseed oil, palm kernel oil, rice bran oil, safflower oil, sesame oil, sunflower oil, tall oil, and mixtures thereof. Epoxidized soybean and linseed oils are preferable and are readily available from suppliers such as Arkema Inc. of King of Prussia, Pa. (Arkema); Hallstar Co. of Chicago, Ill. (Hallster); Ferro Co. of Cleveland, Ohio (Ferro); and Chemtura, Corp. of Middlebury, Conn. (Chemtura).

Additionally, it has now been discovered that raw epoxidized vegetable oil containing salts—as that term is commonly used in chemistry and understood by one of ordinary skill in the art—affects the adhesion of the interlayer while epoxidized vegetable oil without salt does not. In this regard, the amount of salt in the epoxidized oil can be varied in order to control the desired amount of adhesion. Thus, epoxidized vegetable oil, particularly epoxidized soybean oil, which is substantially free of salt is preferred in some embodiments. These epoxidized vegetable oils which are substantially free of salt have, for example, salt values (measured in moles alkali per gram epoxidized vegetable oil) of less than about $8.9 \times 10^{-6}$; less than about $6.7 \times 10^{-6}$; less than about $8.5 \times 10^{-8}$; less than about $4.8 \times 10^{-8}$; about $4.8 \times 10^{-8}$ to about $8.9 \times 10^{-6}$; and about $4.8 \times 10^{-8}$ to $8.5 \times 10^{-8}$. Examples of such epoxidized soybean oil substantially free of salt include Plasthall® ESO (available from Hallstar), Vikoflex® 7170 (available from Arkema), Plas-Chek® ESO (available from Ferro), and Drapex 6.8 (available from Chemtura), with Plas-Chek® ESO and Drapex 6.8 being particularly preferable.

Although preferred, the salt-free epoxidized vegetable oil is by no means necessary, as one of ordinary skill in the art would readily appreciate. In fact, some embodiments of the interlayers disclosed herein include interlayers comprising epoxidized vegetable oil with substantially higher levels of salt.

The method of incorporating the epoxidized vegetable oil into the PVB interlayer to impart the desired properties to the interlayer is not critical. The epoxidized vegetable oil (either alone or in combination with the conventional plasticizer) is preferably added into the melt and extruded. When the interlayer comprises both epoxidized vegetable oil and conventional plasticizer, the combination is referred to herein as a mixture. The epoxidized vegetable oil and conventional plasticizer mixture are provided in the melt at a concentration sufficient to provide the desired performances of flow, glass transition temperature, clarity, and adhesion of the interlayer. For interlayers with the combined conventional plasticizer and epoxidized vegetable oil mixture, the epoxidized vegetable oil is incorporated into the melt with the conventional plasticizers described above at a concentration of epoxidized vegetable oil of about 1 to about 100 phr, about 5 to about 90 phr; about 1 to about 25 phr; about 5 to about 25 phr; about 5 to about 20 phr; and about 8 to about 15 phr. In various embodiments, the mixture can comprise about 15 to about 40 parts conventional plasticizer per one hundred parts poly(vinyl butyral) resin and at least about 1 part epoxidized vegetable oil per one hundred parts poly(vinyl butyral) resin. In other embodiments, the mixture comprises about 25 to about 38 parts conventional plasticizer per one hundred parts poly(vinyl butyral) resin and about 8 to about 15 parts epoxidized vegetable oil per one hundred parts poly(vinyl butyral) resin.

In multilayered interlayers, comprising, for example, skin and core layers, the skin and core layers could comprise the epoxidized vegetable oil in combination with the conventional plasticizer, or comprise the epoxidized vegetable oil alone. For multilayered interlayers with the combined conventional plasticizer and epoxidized vegetable oil, the epoxidized vegetable oil is incorporated into the melts of the skin or core layers with the conventional plasticizers at a concentration described above. For multilayered interlayers with the epoxidized vegetable oil alone, the core layer(s) could comprise about 60 to about 100 or between 2 and 20 parts epoxidized vegetable oil per one hundred parts poly(vinyl butyral) resin, with epoxidized vegetable oil content of the skin layer(s) varying.

In any of these embodiments, the conventional plasticizer and epoxidized vegetable oil can be any of those described above. In preferred embodiments, the epoxidized vegetable oil is either epoxidized soybean oil or epoxidized linseed oil and the plasticizer is triethylene glycol di-(2-ethylhexanoate) ("3GEH").

As noted above, the interlayers of the present disclosure may be used as a single-layer sheet or a multilayered sheet. In various embodiments, the interlayers of the present disclosure (either as a single-layer sheet or as a multilayered sheet) can be incorporated into a multiple layer panel.

As used herein, a multiple layer panel can comprise a single substrate, such as glass, acrylic, or polycarbonate with a polymer interlayer sheet disposed thereon, and most commonly, with a polymer film further disposed over the polymer interlayer. The combination of polymer interlayer sheet and polymer film is commonly referred to in the art as a bilayer. A typical multiple layer panel with a bilayer construct is: (glass) II (polymer interlayer sheet) II (polymer film), where the polymer interlayer sheet can comprise multiple interlayers, as noted above, and wherein at least one of the interlayers comprises epoxidized vegetable oil alone or with conventional plasticizer. The polymer film supplies a smooth, thin, rigid substrate that affords better optical character than that usually obtained with a polymer interlayer sheet alone and functions as a performance enhancing layer. Polymer films differ from polymer interlayer sheets, as used herein, in that polymer films do not themselves provide the necessary penetration resistance and glass retention properties, but rather provide performance improvements, such as infrared absorption characteristics. Poly(ethylene terephthalate) ("PET") is the most commonly used polymer film.

Further, the multiple layer panel can be what is commonly known in the art as a solar panel, with the panel further comprising a photovoltaic cell, as that term is understood by one of ordinary skill in the art, encapsulated by the polymer interlayer(s). In such instances, the interlayer is often laminated over the photovoltaic cell, with a construct such as: (glass) II (polymer interlayer) II (photovoltaic cell) II (polymer interlayer) II (glass or polymer film).

The interlayers of the present disclosure will most commonly be utilized in multiple layer panels comprising two substrates, preferably a pair of glass sheets, with the interlayers disposed between the two substrates. An example of such a construct would be: (glass) II (polymer interlayer sheet) II (glass), where the polymer interlayer sheet can comprise multilayered interlayers, as noted above, and wherein at least one of the interlayers comprises epoxidized vegetable oil. These examples of multiple layer panels are in no way meant to be limiting, as one of ordinary skill in the art would readily recognize that numerous constructs other than those described above could be made with the interlayers of the present disclosure.

The typical glass lamination process comprises the following steps: (1) assembly of the two substrates (e.g., glass) and interlayer; (2) heating the assembly via an IR radiant or convective means for a short period; (3) passing the assembly into a pressure nip roll for the first deairing; (4) heating the assembly a second time to about 70° C. to about 120° C. to give the assembly enough temporary adhesion to seal the edge of the interlayer; (5) passing the assembly into a second pressure nip roll to further seal the edge of the interlayer and allow further handling; and (6) autoclaving the assembly at temperatures between 135° C. and 150° C. and pressures between 150 psig and 200 psig for about 30 to 90 minutes.

Other means for use in de-airing of the interlayer-glass interfaces (steps 2-5) known in the art and that are commercially practiced include vacuum bag and vacuum ring processes in which a vacuum is utilized to remove the air.

Because of increased flow, the interlayers of the present disclosure can be particularly useful with warped glass substrates and other glass with imperfections, including, but not limited to, toughened or tempered glass, heat-strengthened glass, and chemically strengthened glass. Such warped glass substrates are contrasted with annealed (or flat) glass. Warpage is a form of distortion that can occur in many materials, including glass, and usually results from uneven internal or external stresses. For example, as shown with the substrates (10) in FIG. 1, the process of strengthening or toughening glass creates some distortion and roller waves in tempered glass, making it less flat than annealed glass. When assembling the two sheets of tempered glass, gaps are created between the substrates themselves and between the substrates and the interlayer. Therefore, a thicker interlayer was generally utilized in the past to adequately bond the warped glass to the interlayer. With the increased flow of the present interlayer (11), the interlayer (11) is able to conform to the distortions and waves of the warped substrates (10), as depicted in FIG. 1. As a result, a thinner interlayer can be utilized with warped substrates while still maintaining superior bonding and without sacrificing other important properties and characteristics of the interlayer.

Although the embodiments described above refer to the interlayers being particularly useful with warped glass substrates, it would be understood by one of ordinary skill in the art that the interlayers would be particularly useful anytime the flow may be important, including, for example, with mismatched glass and in photovoltaic applications (where flow over electrical components is needed).

In order to help comprehend the interlayer of the present disclosure, it is also useful to have an understanding of the properties and characteristics associated with a polymer interlayer sheet and formulas by which these properties and characteristics of a polymer interlayer sheet are measured. The "flow," as that term is used herein, is measured as the deformation (reduction of sample thickness normalized according to the standard interlayer thickness 0.76 mm) when a certain point load pressure (i.e., 4.5 psi) is applied onto the sample surface in the thickness direction and the sample is being heated from 40° C. to 135° C. at 10° C./min heating rate. The flow is commonly measured as the DF135 by a thermo-mechanical analysis apparatus. As an example, a flow of 0.242 mm means that an interlayer with 0.76 mm thickness will deform 0.242 mm in the thickness direction under the aforementioned testing. The interlayers of the current disclosure have a flow of greater than about 0.20 mm, greater than about 0.22 mm, greater than about 0.23 mm, greater than about 0.24 mm, and about 0.22 mm to about 0.24 mm.

Exudation is a parameter used to measure the compatibility of plasticizers with the associated polymer resin. Compatibility is the ability of the plasticizer to form a homogenous system with the polymer resin. When mixing the plasticizer and polymer in roll mixers or in an extruder the plasticizer is dispersed within the polymer as a result of mechanical energy. To measure exudation, a sheet sample is stored and conditioned under a given relative humidity and a constant temperature and the sheet sample is examined periodically for sign of oil exudation. At the end of test, the surface oil on the sheet is removed and the sheet is then weighed. If the weight of the sample is the same before and after the test, no exudation has occurred.

Another parameter used to describe the polymer interlayers disclosed herein is the clarity, which is determined by measuring the haze value or percent. Light that is scattered upon passing through a film or sheet of a material can produce a hazy or smoky field when objects are viewed through the material. Thus, the haze value is a quantification of the scattered light by a sample in contrast to the incident light. The test for percent haze is performed with a hazemeter, such as Model D25 available from Hunter Associates (Reston, Va.), and in accordance with ATSM D1003-61 (Re-approved 1977)-Procedure A using Illuminant C, at an observer angle of 2 degrees. The interlayers of the present disclosure have a percent haze of less than about 5%, about 3%, about 2%, about 1%, and less than about 1%.

The glass transition temperature also is used to describe the polymer interlayers of the present disclosure. The glass transition temperature ($T_g$) was determined by dynamical mechanical thermal analysis (DMTA). The DMTA measures the storage (elastic) modulus (G') in Pascals, loss (viscous) modulus (G") in Pascals, loss (damping) factor (LF) [tan (delta)] of the specimen as a function of temperature at a given frequency, and temperature sweep rate. A frequency of 1 Hz and temperature sweep rate of 3° C./min were used herein. The $T_g$ is then determined by the position of the loss factor peak on the temperature scale in ° C.

Another parameter used to describe the polymer interlayers disclosed herein is the stack sticking peel force, or the amount of force necessary to peel one polymer interlayer from another polymer interlayer after the two polymer interlayers have been stacked upon one another. Stack sticking peel force is a measurement used to predict the occurrence of blocking or the degree of stack sticking of polymer interlayers when stacked under simulated average customer operating conditions.

Generally, the stack sticking peel force of the disclosed interlayer is determined as follows. First, the sheets are conditioned at a certain temperature for a certain period of time to reach a target moisture level. For example, the polymer interlayers are conditioned (generally in a controlled environment, such as a constant temperature and humidity (RH) chamber) at about 37.2° C. for about four (4) hours to reach a target moisture level of about 0.40%. After conditioning, the polymer interlayers are cut into samples of the same size and then assembled into pairs, with each pair being separated by a polyethylene sheet. The pairs are then placed upon one another to simulate a stack. Generally, a minimum of eight (8) pairs and a maximum of fourteen (14) pairs are used in the test. When the stack is completed, substrate covers (any possible substrate is contemplated) will be placed on top of the stack and weights will be placed on top of the substrate covers to impart an additional downward pressure to the stack. The stack is kept under these conditions for a set period time. In one embodiment, the stack is kept under these conditions for about twenty-four (24) hours. Each sheet pair is then separated from the stack and brought to room temperature conditions. In a next step, each of the separated paired sheets are "peeled" from one another with a peel tester (cross-head speed of 12.7 cm per minute) which is configured to peel the interlayers apart at a 90 degree angle. The force required to separate the sheets is then measured (as an average stack sticking peel force for the sample) by dividing the measured force by the width of test strip of the interlayers and is expressed in the unit of pounds per linear inch ("PLI").

Pummel adhesion is another parameter used to describe the polymer interlayers disclosed herein. The Pummel Adhesion Test is widely used throughout the world and has been a standard Solutia procedure for over 30 years. It measures the adhesion level of glass to the interlayer in a laminate construction. The interlayer to glass adhesion has a large effect on the impact resistance and long term stability of glass-interlayer structures. In this test, the laminates are cooled to 0° F. and manually pummeled with a 1 lb. hammer on a steel plate at a 45 degree angle. The samples are then allowed to come to room temperature and all broken glass unadhered to the interlayer is then removed. The amount of glass left adhered to the interlayer is visually compared with a set of standards. The standards correspond to a scale in which varying degrees of glass remained adhered to the interlayer. For example, at a pummel standard of zero, essentially no glass is left adhered to the interlayer. On the other hand, at a pummel standard of ten, essentially 100% of the glass remains adhered to the interlayer. Pummel values are grouped and averaged for like specimens. Reported values state the average pummel value for the group and the maximum range of the pummel adhesion rating for individual surfaces. The interlayers of the present disclosure have a pummel adhesion rating of greater than 4, greater than 6, and greater than 8.

The final parameter which will be measured is the electrical power output of photovoltaic modules comprising the interlayers disclosed herein. The electrical power output is measured as the maximum power output ($P_{max}$) in Watts on a Spi-Sun Simulator 4600SLP. The $P_{max}$ of the photovoltaic modules were measured at time zero, and also measured over time when the modules were exposed to the damp heat environment. For the latter, the modules were placed into the environmental chamber set to 85° C. and 85% relative humidity, and the modules were removed about once a week, cooled to 25° C., and then tested for the $P_{max}$.

EXAMPLES

The improvements in flow of the presently disclosed interlayers (designated as "Disclosed Interlayers" and as shown as DI 1-4 in Table 1 below) can be most readily appreciated by a comparison to standard prior art conventional interlayers comprising 38 phr triethylene glycol di-(2-ethylhexonate) ("3GEH") (designated as "Conventional Interlayers" and as shown as CI 1 and CI 2 in Table 1 below). Additionally, exemplary Disclosed Interlayers were tested for exudation, clarity, sticking, and pummel adhesion, flow, as well as electrical power output for the PV modules with the Disclosed Interlayers, to demonstrate that these other characteristics were not adversely affected. These examples demonstrate the increased flow of the interlayer, along with other advantageous qualities. The Disclosed Interlayers also maintained other important properties, including no exudation, optimal clarity, low stack sticking, high pummel adhesion, and high electrical output.

The exemplary interlayers were produced by mixing and melt-extruding the mixtures of 100 parts poly(vinyl butyral) resin having 18.7 weight percent residual hydroxyl groups and a vinyl acetate residue of 2% and various amounts of 3GEH, epoxidized soybean oil ("ESO"), and antiblocking agent, as shown in the following Table 1, and other common additives (beyond the antiblocking agent). All the interlayer sheets were conditioned to about 0.4 wt % moisture content.

TABLE 1

| Sample | PVB resin (parts) | 3GEH (phr) | ESO (phr) | Antiblocking agent (phr) | Thickness (mils) |
|---|---|---|---|---|---|
| DI 1 | 100 | 30 | 13 | 0.0 | 22 |
| DI 2 | 100 | 32 | 9 | 0.0 | 22 |
| DI 3 | 100 | 30 | 13 | 0.3 | 22 |
| DI 4 | 100 | 32 | 11 | 0.3 | 22 |

TABLE 1-continued

| Sample | PVB resin (parts) | 3GEH (phr) | ESO (phr) | Antiblocking agent (phr) | Thickness (mils) |
|---|---|---|---|---|---|
| CI 1 | 100 | 38 | 0 | 0.0 | 30 |
| CI 2 | 100 | 38 | 0 | 0.3 | 30 |

Example 1

TABLE 2

| Sample | Flow (DF135) | $T_g$ (° C.) | Exudation |
|---|---|---|---|
| DI 1 | 0.242 mm | 30 | No |
| DI 2 | 0.232 mm | 30 | No |
| CI 1 | 0.211 mm | 30 | No |

Table 2 demonstrates that the combination of conventional plasticizer with the epoxidized soybean oil consistently increases the flow of the interlayer without reducing the $T_g$, as compared to a conventional interlayer. A higher flow interlayer, as demonstrated above, can be particularly useful, for example, with tempered or mismatched glass, as the increase in flow allows the interlayer to fill the gaps that are inherent when the two substrates are assembled. It is equally important that the $T_g$ of the higher flow interlayer is maintained at the same level as the conventional interlayer so that the mechanical strength of the interlayer can be maintained for the equivalent interlayer handling. Additionally, with the proper combination of the amount of conventional plasticizer and the amount of the epoxidized soybean oil, the interlayer does not experience exudation.

Additionally, Table 2 demonstrates the surprising compatibility of epoxidized soybean oil with the associated PVB resin. As noted above, because of the differing characteristics and properties of PVB and PVC, it was previously presumed by those of ordinary skill in the art that epoxidized soybean oil was incompatible with PVB. However, it has now been found that when epoxidized vegetable oil, in the disclosed ranges, is combined with a conventional plasticizer, the epoxidized vegetable oil can be compatible with the PVB resin in a certain range of the compositions. Of course, the exudation will occur if excess epoxidized vegetable oil is added into the PVB resin, which is well understood by one of ordinary skill in the art.

Example 2

TABLE 3

| Sample | % Haze |
|---|---|
| DI 1 | 0.2 |
| DI 2 | 0.2 |
| CI 1 | 0.2 |

Table 3 depicts the results of the haze or optical clarity test. This table demonstrates that the laminates with the epoxidized soybean oil maintained a very low haze level. In fact, the clarity (haze level) of the laminates containing a polymer interlayer having the addition of the epoxidized soybean oil was comparable to the clarity or haze level of the conventional interlayer.

Example 3

TABLE 4

| Sample | Stack Sticking Peel Force (PLI) |
|---|---|
| DI 3 | 6.68 |
| DI 4 | 8.10 |
| CI 2 | 10.31 |

Table 4 depicts the results of the stack sticking peel force test. In this test, the stacks are kept under the pressure of 69000 Pa at 40° C. for 24 hrs. The results shown in Table 4 demonstrate that the stack sticking peel force is favorably reduced with the addition of the epoxidized soybean oil when compared to conventional interlayer.

Example 4

TABLE 5

| Sample | Pummel Adhesion |
|---|---|
| DI 1 | 7.17 |
| DI 2 | 8.00 |
| CI 1 | 8.83 |

Table 5 depicts the results of the pummel adhesion test. This table demonstrates that the pummel adhesion of the laminates containing a polymer interlayer having the addition of the epoxidized soybean oil was comparable to the pummel adhesion of the conventional interlayer.

Example 5

Photovoltaic modules were laminated using Sample DI 3, with Sample CI 1 (as described in Table 1) as the comparison. The modules comprise 3 mm glass, and a 5-inch by 5-inch crystalline PV cell with standard tabbing wire. The lamination was conducted on a Nisshinbo 1522N vacuum laminator at 165° C. with a 4 minute vacuum time and a 7 minute press time. The laminated PV modules were then cooled while still under pressure to 120° C. Standard testing of both modules showed that PV modules containing the Disclosed Interlayers as well as PV modules containing the Conventional Interlayer had no shrink or bubbling issues, although the Disclosed Interlayer (22 mils) was about 27% thinner in thickness than the Conventional Interlayer (30 mils).

The laminated PV modules were then tested for the maximum electrical power output according to the above described test. The results of this testing are shown below in Table 6.

TABLE 6

| Hours Exposed in Damp Heat (85° C./85% RH) | Module Power, $P_{max}$/W | |
|---|---|---|
| | Sample DI 3 | Sample CI 1 |
| 0 | 5.5 | 5.9 |
| 114.75 | 5.9 | 6.0 |
| 301.75 | 5.6 | 5.9 |
| 445.25 | 5.2 | 5.7 |

Table 6 demonstrates that the maximum power output $P_{max}$ of the module laminated with the polymer interlayer having the addition of the epoxidized soybean oil was comparable to the maximum power output $P_{max}$ of the module laminated with the conventional interlayer.

Example 6

Exemplary multilayered interlayers (designated as "Multilayered Interlayers and as shown as MLI 5-7 in Table 7 below) were prepared by first making individual layers (skin and core layers) and then laminating them together to form the interlayer. The skin layers were produced by mixing and melt-extruding the mixtures of 100 parts poly(vinyl butyral) resin having 17.7 to 18.7 weight percent residual hydroxyl groups and epoxidized soybean oil ("ESO") added at an amount of about 45 phr and about 40 phr, as shown in the following Table 7, and other common additives. The skin layers were produced at thicknesses of about 7 mils and about 20 mils. The core layers were produced by mixing and melt-extruding the mixtures of 100 parts poly(vinyl butyral) resin having 9.2 weight percent residual hydroxyl groups and epoxidized soybean oil ("ESO") added at an amount of about 90 phr, as shown in the following Table 7, and other common additives. The core layers were produced at thicknesses of about 10 mils and about 20 mils. All the skin and core layers were conditioned to about 0.4 wt % moisture content. The skin layers were then laminated together with the respective core layer (although the layers could alternatively have been co-extruded). In the examples in Table 7 below, the composition and thickness of the skin layers is the same for each respective multilayered interlayer. Skin layers having the same composition, however, is by no means necessary.

TABLE 7

| | Skin Layer 1 and 3 | | | | Core Layer 2 | | | |
|---|---|---|---|---|---|---|---|---|
| Sample | % PVOH content of PVB resin | ESO (phr) | Layer thickness (mils) | Tg's (° C.) | % PVOH content of PVB resin | ESO (phr) | Layer thickness (mil) | Tg's (° C.) |
| MLI 5 | 17.7 | 45 | 20 | 39 | 9.2 | 90 | 10 | 4 |
| MLI 6 | 17.7 | 45 | 7 | 39 | 9.2 | 90 | 20 | 4 |
| MLI 7 | 18.7 | 40 | 7 | 39 | 9.2 | 90 | 20 | 4 |

Table 7 shows the configurations of examples of Multilayered Interlayers comprised of PVB resins having different weight percent residual hydroxyl groups and different content of ESO in skin layers 1 and 3 and core layer 2, respectively. As shown in Table 7, such multilayered interlayers have two $T_g$'s, one for the skin layers and the other for the core layer. Typically, an interlayer with a very low $T_g$ (such as the core layers in MLI 5-7) could provide desired noise reduction, but it would be very sticky and soft and difficult to handle and would not have good impact resistance. On the other hand, an interlayer having a standard $T_g$ (such as the skin layers in MLI 5-7) provides good impact resistance and no issues with handling (i.e., no blocking), but does not provide the desired noise reduction performance. The Multilayered Interlayers in Tables 7, however, provide these two desired attributes of noise reduction and impact resistance in one multilayered interlayer which is easy to handle and not subject to blocking, i.e., combined performance of noise reduction (as a result of the core layer which has very low $T_g$) and good handling and impact resistance performance as a result of the skin layers (which have higher $T_g$'s).

In conclusion, the interlayers comprising epoxidized vegetable oils described herein have numerous advantages over conventional interlayers previously utilized in the art. In general, use of the epoxidized vegetable oil alone or in combination with a conventional plasticizer results in decreased processing and raw material costs for manufacturing of multiple layer glass panels and increased efficiency and overall output. In addition to these benefits, in comparison to polymer interlayers previously utilized in the art, the polymer interlayers comprising epoxidized vegetable oil as described herein have an increased flow without sacrificing other properties that one of ordinary skill in the art would expect with an increase in flow. Other advantages will be readily apparent to those skilled in the art.

While the invention has been disclosed in conjunction with a description of certain embodiments, including those that are currently believed to be the preferred embodiments, the detailed description is intended to be illustrative and should not be understood to limit the scope of the present disclosure. As would be understood by one of ordinary skill in the art, embodiments other than those described in detail herein are encompassed by the present invention. Modifications and variations of the described embodiments may be made without departing from the spirit and scope of the invention.

It will further be understood that any of the ranges, values, or characteristics given for any single component of the present disclosure can be used interchangeably with any ranges, values or characteristics given for any of the other components of the disclosure, where compatible, to form an embodiment having defined values for each of the components, as given herein throughout. For example, an interlayer can be formed comprising poly(vinyl butyral) having a residual hydroxyl content in any of the ranges given in addition to comprising a plasticizers in any of the ranges given and in addition to comprising epoxidized plant oil in any of the ranges given, where appropriate, to form many permutations that are within the scope of the present disclosure, but that would be cumbersome to list. Further, ranges provided for a genus or a category, such as epoxidized vegetable oil, can also be applied to species within the genus or members of the category, such as epoxidized soybean oil, unless otherwise noted.

The invention claimed is:

1. A single layer sheet interlayer comprising:
poly(vinyl butyral) resin; and
a mixture comprising:
at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate; and
epoxidized vegetable oil;
wherein the single layer sheet interlayer comprises about 33 to about 53 parts of the mixture per one hundred parts of the poly(vinyl butyral) resin, wherein the mixture comprises about 25 to about 38 parts of the plasticizer per one hundred parts of the poly(vinyl butyral) resin and about 8 to about 15 parts of the epoxidized vegetable oil per one hundred parts of the poly(vinyl butyral) resin, and wherein the single layer sheet interlayer has a flow of at least 0.20 mm measured as the DF135 by a thermo-mechanical analysis apparatus and a glass transition temperature (Tg) of about 30° C. to 35° C.

2. The interlayer of claim 1, wherein the mixture comprises about 29 to about 32 parts of the plasticizer per one hundred parts of the poly(vinyl butyral) resin.

3. The interlayer of claim 2, wherein the mixture comprises about 9 to about 13 parts of the epoxidized vegetable oil per one hundred parts of the poly(vinyl butyral) resin.

4. The interlayer of claim 1, wherein the epoxidized vegetable oil is selected from the group consisting of: epoxidized soybean oil and epoxidized linseed oil.

5. The interlayer of claim 1, wherein the epoxidized vegetable oil is epoxidized soybean oil.

6. The interlayer of claim 5, wherein the plasticizer is triethylene glycol di-(2-ethylhexanoate).

7. The interlayer of claim 1, wherein the single layer sheet interlayer has a flow of at least 0.22 mm measured as the DF135 by a thermo-mechanical analysis apparatus.

8. The interlayer of claim 1, wherein the single layer sheet interlayer has a flow of at least 0.23 mm measured as the DF135 by a thermo-mechanical analysis apparatus.

9. A multiple layer panel, the panel comprising:
at least one rigid substrate; and
a single layer sheet interlayer comprising:
poly(vinyl butyral) resin; and
a mixture comprising:
at least one plasticizer selected from the group consisting of: triethylene glycol di-(2-ethylhexanoate), triethylene glycol di-(2-ethylbutyrate), triethylene glycol diheptanoate, tetraethylene glycol diheptanoate, dihexyl adipate, dioctyl adipate, hexyl cyclohexyladipate, diisononyl adipate, heptylnonyl adipate, and dibutyl sebacate; and
epoxidized vegetable oil;
wherein the single layer sheet interlayer comprises about 33 to about 53 parts of the mixture per one hundred parts of the poly(vinyl butyral) resin, wherein the mixture comprises about 25 to about 38 parts of the plasticizer per one hundred parts of the poly(vinyl butyral) resin and about 8 to about 15 parts of the epoxidized vegetable oil per one hundred parts of the poly(vinyl butyral) resin, and wherein the single layer sheet interlayer has a flow of at least 0.20 mm measured as the DF135 by a thermo-mechanical analysis apparatus and a glass transition temperature (Tg) of about 30° C. to 35° C.

10. The multiple layer panel of claim 9, wherein the mixture comprises about 9 to about 13 parts of the epoxidized vegetable oil per one hundred parts of the poly(vinyl butyral) resin.

11. The multiple layer panel of claim 9, wherein the epoxidized vegetable oil is selected from the group consisting of: epoxidized soybean oil and epoxidized linseed oil.

12. The multiple layer panel of claim 9, wherein the panel further comprises a photovoltaic cell, wherein the single layer sheet interlayer encapsulates the photovoltaic cell.

13. The multiple layer panel of claim 9, wherein the single layer sheet interlayer has a flow of at least 0.22 mm measured as the DF135 by a thermo-mechanical analysis apparatus.

14. The multiple layer panel of claim 9, wherein the single layer sheet interlayer has a flow of at least 0.23 mm measured as the DF135 by a thermo-mechanical analysis apparatus.

* * * * *